United States Patent [19]

Purdes

[11] Patent Number: 5,170,329
[45] Date of Patent: Dec. 8, 1992

[54] STRESS FREE CHIP MOUNT AND METHOD OF MANUFACTURE

[75] Inventor: Andrew J. Purdes, Garland, Tex.

[73] Assignee: Texas Instruments Incorporated, Dallas, Tex.

[21] Appl. No.: 766,684

[22] Filed: Sep. 27, 1991

[51] Int. Cl.⁵ .......................... H05K 3/30; H05K 7/20
[52] U.S. Cl. ...................... 361/400; 29/832; 361/388; 361/419
[58] Field of Search .................. 174/255, 260, 252; 29/832; 361/400, 403, 418, 419

[56] References Cited

U.S. PATENT DOCUMENTS 4,529,836 7/1985 Powers et al. ................. 361/400
5,112,648 5/1992 Okonogi et al. ................ 174/259

OTHER PUBLICATIONS

Carlson, R. O. et al, "Thermal Expansion Mismatch in Electronic Packaging" Material Research Society Symposium Proceeding, vol. 40 (1985).

Primary Examiner—P. W. Echols
Attorney, Agent, or Firm—Richard A. Stoltz; Richard L. Donaldson; Jay Cantor

[57] ABSTRACT

A chip mount is provided for mounting a chip on a circuit board to reduce stresses caused by thermal expansion mismatch between the chip and the circuit board. The chip mount includes a strip member secured to the chip and a guide layer secured to the circuit board. The guide layer includes slots formed therein for slidably receiving and holding the strip member such that upon expansion or contraction of the chip relative to the circuit board, the strip member slides in the slot to reduced stresses resulting from the expansion or contraction of the chip. The guide layer and the strip member are formed of materials that are generally non-reactive to inhibit bonding of the guide layer to the strip member.

17 Claims, 1 Drawing Sheet

U.S. Patent  Dec. 8, 1992  5,170,329

STRESS FREE CHIP MOUNT AND METHOD OF MANUFACTURE

TECHNICAL FIELD OF THE INVENTION

This invention relates generally to chip mounts and methods for mounting semiconductor chips on circuit boards. More particularly, this invention relates to chip mounts and methods for mounting chips on circuit boards for reducing stresses caused by thermal expansion mismatch between the chip and the circuit board.

BACKGROUND OF THE INVENTION

An important aspect of using semiconductor chips is removing heat generated by the chips during use. If a chip is bonded to a circuit board, the heat generated by the chip can be transferred to the circuit board. To maximize such heat transfer, the circuit board should be made of a material having high thermal conductivity. A preferred material for the circuit board is diamond, which has the highest thermal conductivity of any material. Diamond unfortunately has a coefficient of thermal expansion that is substantially different from that of typical chip material like silicon or gallium arsenide; diamond has a thermal expansion coefficient of 0.8 parts per million/K, while silicon and gallium arsenide have coefficients of thermal expansion of three and seven parts per million/K, respectively.

If an elevated temperature process such as soldering is used to bond a semiconductor chip to a diamond circuit board, the chip will have high tensile stresses after the chip and the circuit board have cooled to room temperature due to the thermal expansion mismatch between the chip and the circuit board. These stresses may cause the chip to crack. Additionally, thermal cycling during the soldering process or during use of the chip may lead to a failure of the bond between the chip and the circuit board.

A need has thus arisen for a chip mount or a method of mounting a chip on a circuit board that reduces stresses caused by thermal expansion mismatch between the chip and the circuit board.

SUMMARY OF THE INVENTION

A chip mount is provided for mounting a chip on a circuit board to reduce stresses caused by thermal expansion mismatch between the chip and the circuit board. The chip mount includes a strip member secured to the chip and a guide layer secured to the circuit board. The guide layer includes a slot formed therein for slidably receiving and holding the strip member such that upon expansion or contraction of the chip relative to the circuit board, the strip member slides in the slot to reduce stresses resulting from the expansion or contraction of the chip. The guide layer and the strip member are formed of materials that are generally non-reactive to inhibit bonding of the guide layer and the strip member.

A method is also provided for mounting a chip on a circuit board to reduce stresses caused by thermal expansion mismatch between the chip and the circuit board. A strip member is first placed on the circuit board for sliding movement thereon. Then a guide layer is formed on the circuit board with a slot therein for holding and slidably receiving the strip member. The guide layer and strip member comprise materials that are generally non-reactive to inhibit bonding of the guide layer and the strip member. The strip member is secured to the chip.

A technical advantage of this invention is that it provides a chip mount and method of mounting a chip on a circuit board that reduces stresses caused by thermal expansion mismatch between the chip and the circuit board.

BRIEF DESCRIPTION OF THE DRAWINGS

The foregoing and additional objects and advantages of the invention will become more apparent as the following detailed description is read in conjunction with the accompanying drawings, wherein like reference characters denote like parts in all views and wherein.

DETAILED DESCRIPTION OF THE INVENTION

Figure 1:
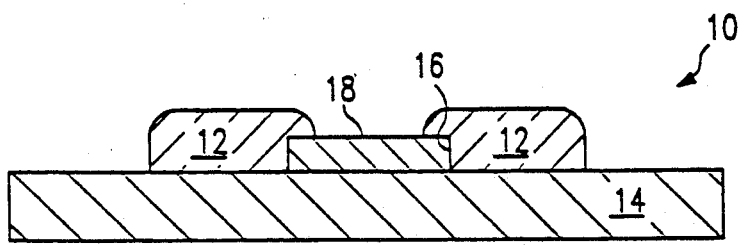
FIG. 1 is a partial, cross-sectional view of a chip mount constructed in accordance with one embodiment of the invention, illustrating the formation of a guide layer of the chip mount around a strip member.

FIG. 1 is a partial, cross-sectional view of a chip mount generally indicated by reference character 10 and constructed in accordance with one embodiment of the invention. The chip mount 10 includes a guide layer 12, which is bonded to a circuit board 14. The guide layer 12 includes a slot 16 formed therein for a slidably receiving and holding a strip member 18. The strip member 18 may be secured to a chip (not shown) so that upon expansion or contraction of the chip relative to the circuit board 14, the strip member 18 slides in the slot 16, thereby reducing stresses caused by thermal expansion mismatch between the chip and the circuit board.

The circuit board 14 is preferably made from a material having high thermal conductivity to enhance heat transfer from the chip to the circuit board. Diamond is the preferred material as it has the highest thermal conductivity of any material. Diamond is also preferred because it has a low coefficient of friction, which allows the strip member 18 to slide easily across the circuit board 14.

The guide layer 12 and the strip member 18 should be formed of materials that do not generally react with each other. Such a combination of materials prevents the guide layer 12 and the strip member 18 from becoming bonded, which would inhibit free movement of the strip member 18. The strip member 18 and the guide layer 12 may comprise copper and thin film diamond, respectively. This combination of materials is suitable because diamond does not react with copper at temperatures as high as 1000° celsius. Thus, if the chip is soldered to the circuit board, the heat from the soldering process will not cause the strip to become bonded to the guide layer 12 or the diamond circuit board 14.

Another advantage to using diamond as material for the guide layer 12 is that diamond can be readily grown on the diamond circuit board 14 without becoming deposited on or bonded to the copper strip member 18. The guide layer 12 may be formed on the circuit board 14 by using, for example, low pressure microwave or hot filament processes for growing thin film diamond.

To form the guide layer 12 with the slot 16 for holding the strip member 18, the strip member 18 is first placed on the circuit board 14. Then, using the microwave or hot filament process, a diamond film is deposited on the circuit board 14 to form the guide layer 12. During the process, the diamond film will first grow on the diamond circuit board 14 up to the height of the strip member 18. The diamond film will then be formed partially over the top of the strip member 18, thereby forming the slot 16 for holding the strip 18. The diamond will not normally grow on the copper strip member 18.

As diamond has a low coefficient of friction, the strip member 18 can slide freely in the guide layer 12.

Figure 2:
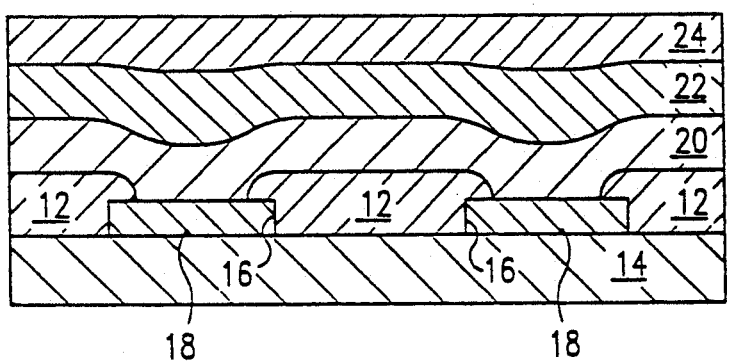
FIG. 2 is a partial cross-sectional view of a chip mount as it is used in mounting a chip to a circuit board.

FIG. 2 illustrates use of the chip mount 10 to bond a chip 24 to the circuit board 14. FIG. 2 shows a chip mount 10 having a guide layer 12 with two slots 16 formed therein for holding two strip members 18.

A bonding layer 20 is applied over the guide layer 12 and the strip members 18. The bonding layer 20 should become bonded to the strip members 18, but not the guide layer 12. A suitable material for the bonding layer 20 is copper as copper will bond to the exposed portions of the copper strip members 18, but not to the diamond guide layer 12. Copper is also a good choice for the bonding layer 20 because it is a reasonably good conductor of heat. The chip 24 may then be bonded to the bonding layer 20 by means of a layer of solder material 22. By using this method of mounting a chip on the circuit board, a sliding thermal contact is formed between the chip 24 and the circuit board 14.

The thickness of the strip members 18, guide layer 12 and the bonding layer 20 may be, for example, one, two and five microns, respectively.

Figure 3:
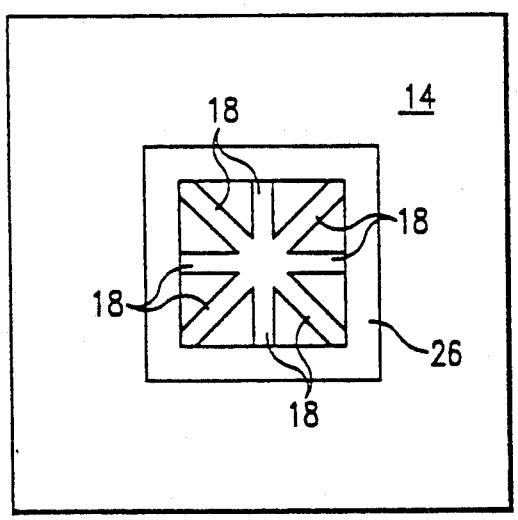
FIGS. 3 and 4 are top views of a chip mount in two stages of completion.
Figure 4:
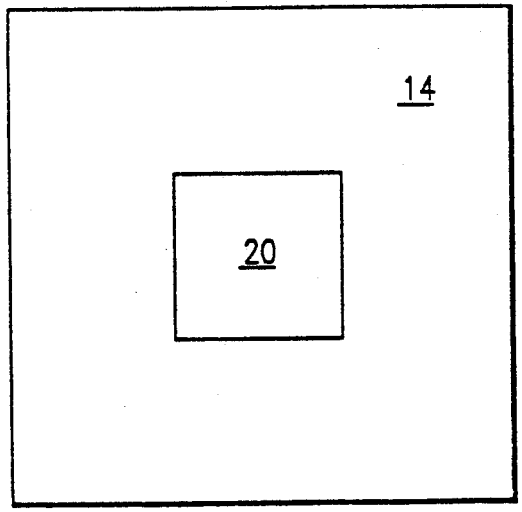

FIGS. 3 and 4 illustrate the chip mount 12 in two stages of completion. FIG. 3 is a top view of the circuit board 14, on which a plurality of strip members 18 have been placed. Of primary concern is the horizontal, two-dimensional thermal expansion or contraction of the chip 24 relative to the circuit board 14. Consequently, it is preferred that the strip members 18 be arranged such that they are all joined at one of their ends. For example, they may extend radially from the center of the chip mount 10 as shown in FIG. 3. This arrangement of strip members 18 allows the chip mount to more fully accommodate the thermal expansion mismatch between the chip and the circuit board 14.

The strip members 18 are joined at their outer or free ends to a fence 26. The purpose of the fence 26 is to prevent diamond deposition over the ends of the strip members 18, which would inhibit free movement of the strip members 18. Since the strip members 18 are made of copper, the fence 26 may also be made of copper. After the strips 18 and the fence 26 have been placed on the diamond board 14, the thin film of diamond is deposited on the circuit board 14 using microwave or hot filament processes to form the guide layer 12. Once the guide layer 12 is formed, the copper fence 26 is removed by lithography or etching techniques. Then as shown in FIG. 4, the bonding layer 20 is applied over the strip members 18 and the guide layer 12. The bonding layer 20 bonds with the strip members 18, but not the guide layer 12. To mount the chip 24 on the circuit board 14, the chip 24 may be soldered to the bonding layer 20.

It is preferable that the strip members 18 be elongated so that their expansion will occur longitudinally in the slot 16 in a manner unrestricted by the guide layer 12. Expansion of the strip members 18 in a sideways direction is preferably minimized as such expansion would be hindered by the guide layer 12 and may cause cracking of the guide layer 12.

It is also preferable that the total surface area of the strip members 18 be large to allow increased heat transfer from the chip 24 to the diamond board 14. Therefore, the total number of strip members 18 should be maximized.

While the materials used for the guide layer 12 and the strip members 18 in the embodiment described above are diamond and copper, respectively, other combinations of materials that are generally non-reactive may also be used. The materials should be such that they allow for selective deposition of guide layer material over the circuit board and the strip members.

Although the present invention has been described with respect to a specific, preferred embodiment thereof, various changes and modifications may be suggested to one skilled in the art, and it is intended that the present invention encompasses such changes and modifications as fall within the scope of the appended claims.

What is claimed is:

1. A chip mount for mounting a chip on a circuit board to reduce stresses caused by thermal expansion mismatch between the chip and the circuit board, comprising:
   at least one strip member secured to the chip; and
   a guide layer secured to the circuit board, said guide layer having slots formed therein for slidably receiving and holding said strip members such that upon expansion or contraction of the chip relative to the circuit board, said strip members slide in said slots to reduce stresses resulting from the expansion or contraction of the chip, said guide layer and said strip members being formed of materials that are generally non-reactive to inhibit bonding of said guide layer and said strip members.

2. The chip mount of claim 1, wherein said strip members are elongated.

3. The chip mount of claim 1, wherein said strip members comprise copper and said guide layer comprises diamond.

4. The chip mount of claim 1, further comprising a bonding layer solderable to the chip applied over said guide layer and said strip members for bonding with said strip members, but not with said guide layer.

5. The chip mount of claim 4, wherein said bonding layer comprises copper.

6. The chip mount of claim 1, wherein said strip members are arranged such that they extend radially from a point on the chip mount.

7. The chip mount of claim 1, wherein said strip members are arranged such that they extend radially from the center of the chip mount.

8. A method of mounting a chip on a circuit board to reduce stresses caused by thermal expansion mismatch between the chip and the circuit board, the method comprising the steps of:
   placing at least one strip member on the circuit board for sliding movement thereon;
   forming a guide layer on the circuit board, the guide layer having slots formed therein for holding and slidably receiving each strip member, the guide layer and the strip members comprising materials that are generally non-reactive to inhibit bonding of the guide layer and the strip members; and
   securing the strip members to the chip.

9. The method of claim 8, wherein said step of forming a guide layer comprises depositing a diamond film on the circuit board up to the height of the strip members and then partially over the strip members, thereby forming the slots for holding the strip members.

10. The method of claim 8, wherein said step of securing the strip members to the chip comprises applying a bonding layer over the guide layer and the strip members such that the bonding layer adheres to the strip members, but not to the guide layer, and further comprising the step of soldering the chip to the bonding layer.

11. The method of claim 10, wherein said step of applying a bonding layer comprises applying a copper layer.

12. The method of claim 8, wherein said step of placing at least one strip member on the circuit board comprises arranging a plurality of strip members on the circuit board such that they extend radially from a point on the circuit board.

13. The method of claim 12, further comprising the step of positioning a fence adjacent the outer ends of the strip members prior to said step of forming a guide layer to inhibit formation of the guide layer over the free ends of the strip members, the method also comprising the step of removing the fence after said step of forming the guide layer.

14. A method of making a chip mount for mounting a chip on a circuit board to reduce stresses caused by thermal expansion mismatch between the chip and the circuit board, the method comprising the steps of:
  positioning a strip member, bondable to the chip on the circuit board for sliding movement thereon; and
  forming a guide layer on the circuit board up to the height of the strip member and then partially over the strip member, thereby forming a slot for holding and slidingly receiving the strip member, the strip member and the guide layer formed of materials that are generally non-reactive so as to inhibit bonding of the guide layer and the strip member and allow the strip member to slide freely in the slot.

15. A method of mounting a semiconductor chip on a diamond circuit board to reduce stresses caused by thermal expansion mismatch between the chip and the circuit board, the method comprising:
  positioning at least one elongated copper strip on the circuit board;
  depositing a layer of diamond on the circuit board up to the height of the strip members and then partially over the strip members, thereby forming a guide layer with slots for holding and slidingly receiving the strip members;
  depositing a copper layer over the guide layer and the strip members such that the copper layer bonds to the strip members, but not the guide layer; and
  soldering the chip to the copper layer.

16. The method of claim 15, wherein said step of positioning at least one elongated copper strip on the circuit board comprises arranging a plurality of copper strips on the circuit board such that they extend radially from a point on the circuit board.

17. The method of claim 16, further comprising the step of placing a copper fence adjacent the outer ends of the strip members prior to said step of depositing a layer of diamond to inhibit formation of the guide layer over the outer ends of the strip members, the method also comprising the step of removing the copper fence after said step of depositing a layer of diamond.

* * * * *